United States Patent
Yamagishi et al.

(10) Patent No.: US 7,520,244 B2
(45) Date of Patent: Apr. 21, 2009

(54) PLASMA TREATMENT APPARATUS

(75) Inventors: Takayuki Yamagishi, Tama (JP); Hiroki Arai, Tama (JP); Kiyoshi Satoh, Tama (JP)

(73) Assignee: ASM Japan K.K., Tokyo (JP)

( * ) Notice: Subject to any disclaimer, the term of this patent is extended or adjusted under 35 U.S.C. 154(b) by 365 days.

(21) Appl. No.: 10/807,528

(22) Filed: Mar. 23, 2004

(65) Prior Publication Data

US 2004/0194709 A1  Oct. 7, 2004

(30) Foreign Application Priority Data

Apr. 4, 2003  (JP) ............................. 2003-101993

(51) Int. Cl.
- C23C 16/00 (2006.01)
- C23F 1/00 (2006.01)
- H01L 21/306 (2006.01)
- H01J 7/24 (2006.01)
- H05B 31/26 (2006.01)

(52) U.S. Cl. .............................. 118/723 E; 156/345.43; 156/345.44; 156/345.47; 315/111.21; 315/111.91

(58) Field of Classification Search ............ 156/345.47, 156/345.44; 118/723 E; 315/111.21, 111.91
See application file for complete search history.

(56) References Cited

U.S. PATENT DOCUMENTS

| | | | | |
|---|---|---|---|---|
| 3,995,237 A | * | 11/1976 | Brunner | 333/17.3 |
| 5,182,427 A | * | 1/1993 | McGaffigan | 219/663 |
| 5,195,045 A | * | 3/1993 | Keane et al. | 702/107 |
| 6,190,496 B1 | * | 2/2001 | DeOrnellas et al. | 156/345.44 |
| 6,254,738 B1 | * | 7/2001 | Stimson et al. | 204/192.12 |
| 6,262,638 B1 | * | 7/2001 | Scherer | 333/174 |
| 6,353,201 B1 | | 3/2002 | Yamakoshi et al. | |
| 6,363,881 B2 | * | 4/2002 | Murata et al. | 118/723 E |
| 6,456,010 B2 | * | 9/2002 | Yamakoshi et al. | 315/111.21 |
| 6,884,635 B2 | * | 4/2005 | Parsons | 438/10 |
| 2001/0046567 A1 | | 11/2001 | Matsuki et al. | |
| 2002/0046989 A1 | * | 4/2002 | Blonigan et al. | 219/121.43 |
| 2003/0052785 A1 | * | 3/2003 | Gisselberg et al. | 340/572.8 |

FOREIGN PATENT DOCUMENTS

JP  P3332857  7/2002

OTHER PUBLICATIONS

D.He et al., Longitudinal voltage distribution in transverse RF discharge waveguide lasers, J. Appl. Phys. 54(8), Aug. 1983, pp. 4367-4373.

* cited by examiner

Primary Examiner—Parviz Hassanzadeh
Assistant Examiner—Rakesh K Dhingra
(74) Attorney, Agent, or Firm—Knobbe, Martens, Olson & Bear LLP

(57) ABSTRACT

A plasma treatment apparatus for thin-film deposition includes a reactor chamber; a pair of parallel-plate electrodes disposed inside the chamber; and a radio-frequency power supply system used for transmitting radio-frequency power to one of the parallel-plate electrodes via multiple supply points provided on the one of the parallel-electrodes. The radio-frequency power supply system includes a radio-frequency transmission unit which includes an inlet transmission path and multiple branches branched off from the inlet transmission path multiple times. Each branch is connected to the supply point and has a substantially equal characteristic impedance value.

18 Claims, 5 Drawing Sheets

PLASMA TREATMENT APPARATUS

BACKGROUND OF THE INVENTION

1. Field of the Invention

The present invention relates to a plasma treatment apparatus for forming a thin film on a semiconductor substrate or a glass substrate, particularly to a radio-frequency power supply system configured to supply radio-frequency power to a discharge electrode.

2. Description of the Related Art

In recent years, to accelerate LSI device speed, copper having less electrical resistance has become more used as a metal interconnect material than aluminum. Concurrently, to reduce interconnect capacitance causing signal delay, carbon-containing silicon oxide films having low dielectric constant have become more used as an interlayer insulator material. As a method for forming carbon-containing silicon oxide films, a material having a siloxane structure and 27.12 MHz radio-frequency power are used to achieve a given deposited film structure (e.g., U.S. Patent Publication No. 2001/0046567).

13.56 MHz radio-frequency power, which has been used, promotes decomposition of a source gas having a siloxane structure and in fact decomposes the siloxane structure before a reaction gas (i.e., a mixture of the source gas and various additive or other gases) reaches a semiconductor substrate. In contrast, 27.12 MHz radio-frequency power enables carbon-containing silicon oxide films to deposit on the semiconductor substrate without destroying the siloxane structure of the source gas.

Additionally, as barrier films for preventing copper diffusion, silicon nitride films having a dielectric constant of approximately 7 had been used. Recently, silicon carbide films having a dielectric constant of approximately 4 to 5 have begun to be used. To form the silicon carbide films, an alkyl-silicon compound having intramolecular silicon-carbon bonds is used as a source gas. If reaction gas decomposition is promoted and becomes excessive, hydrogen atoms are discharged from alkyl groups in reaction gas molecules and are taken into the film. In the result, leakage current in silicon carbide films reaches a high level of $1 \times 10^{-7}$ A/cm$^2$ (when an electric field applied to the silicon carbide films for measuring leakage current is set at 2 MV/cm), causing an electrical current to leak into a metal interconnection. To lower a leakage current level of silicon carbide films, using relatively high 27.12 MHz radio-frequency power is effective for inhibiting hydrogen atoms in alkyl groups contained in the reaction gas from dissociating therefrom.

Furthermore, to reduce production costs of LSI devices, use of 300 mm diameter semiconductor substrates has begun in recent years. Based on this trend, uniformity of large-area treatment has become a requirement; particularly for a parallel-plate-type plasma treatment apparatus which treats one or multiple semiconductor substrates in a reactor (e.g. a plasma CVD apparatus, and a plasma etching apparatus), uniform temperature distribution and uniform plasma formation between electrodes are required throughout a semiconductor substrate surface. In large-area parallel-plate-type electrodes, which use radio-frequency power of 27.12 MHz or higher, electric field distribution becomes non-uniform due to voltage distribution affected by standing waves (e.g. "Longitudinal voltage distribution in transverse rf discharge waveguide lasers" by D. He et al., J. Appl. Phys. 54(8), August. 1983, p.4367).

This non-uniform electric field distribution causes non-uniform growth rates of a film formed on a semiconductor substrate, making it impossible to obtain a film having a uniform thickness on the entire surface. To solve this problem, a method of applying radio-frequency power equally to each of multiple power supply points of a discharge electrode by distributing the radio-frequency power using multiple coaxial cables having equal length and equal characteristic impedance was reported (e.g. JP Patent No. 3332857, U.S. Pat. No. 6,353,201). Using this method, film thickness non-uniformity of ±10% or less has been achieved.

Film thickness non-uniformity required for a manufacturing apparatus for recent LSI devices is ±3% or less for 300 mm diameter semiconductor substrates. Even if an impedance matching box and a discharge electrode are connected using coaxial cables having equal length and equal characteristic impedance, characteristic impedance of each radio-frequency channel does not become practically uniform due to stray capacitance arising between the radio-frequency channels and their peripheral parts and/or individual characteristic-impedance differences caused by characteristic errors of the coaxial cables. Additionally, individual differences of losses also arise at each connection of a coaxial cable and a power supply point. As a result, the electric field becomes non-uniform and film thickness non-uniformity becomes approximately ±10%, and thus film thickness non-uniformity within ±3%, which is required for recent LSI devices, cannot be achieved.

SUMMARY OF THE INVENTION

Consequently, an object of the present invention in an embodiment is to provide a plasma treatment apparatus which can achieve film thickness non-uniformity of ±3% or less in film deposition onto a large-area semiconductor substrate having a diameter of 300 mm, for example.

Another object of the present invention in an embodiment is to provide a method of forming a carbon-containing silicon oxide film having a low dielectric constant and high mechanical strength.

Additional object of the present invention in an embodiment is to provide a method for forming a nitrogen-containing silicon carbide film having a low dielectric constant and less leakage current.

The present invention should not be limited to the above objects, and in one embodiment, one or more objects can be achieved, and in another embodiment, other objects can be achieved.

To achieve one or more of the above-mentioned objects, in an embodiment, the present invention provides a plasma treatment apparatus for thin-film deposition comprising: (I) a reactor chamber; (II) a pair of parallel-plate electrodes disposed inside the chamber, between which a thin film is to be formed on a substrate; and (III) a radio-frequency power supply system used for transmitting radio-frequency power to one of the parallel-plate electrodes via multiple supply points provided on the one of the parallel-electrodes, said radio-frequency power supply system comprises: (A) a radio-frequency power source; and (B) a radio-frequency transmission unit for transmitting radio-frequency power from the radio-frequency power source to the multiple supply points of the one of the parallel-plate electrodes, said radio-frequency transmission unit comprising: (a) an inlet transmission path and multiple branches branched off from the inlet transmission path, wherein each branch connected to the supply point of the parallel-electrode is multiple branchings downstream of the inlet transmission path and has a substantially equal characteristic impedance value; and (b) at least one inductance adjuster which is removably installed in at least one branch to render substantially equal the characteristic impedance value of each branch connected to the multiple supply points. In the above, in an embodiment, the radio-frequency power supply system further comprises an impedance matching circuit between the radio-frequency power source and the radio-frequency transmission unit. The impedance matching circuit may be connected to the radio-frequency transmission unit by a co-axial cable.

Each branch connected to the multiple supply point may be two branchings (in another embodiment, 3 or 4 branchings) downstream of the inlet transmission path, and four branches (in another embodiment, 8 or 16 branches) may be connected to the multiple supply points. The number of branchings from the upstream to the downstream can be adjusted, and further, the number of branches connected to the multiple supply points (i.e., the number of multiple supply points) can be adjusted. For example, there are one primary path, two secondary branches (at the first level of branching), and four tertiary or final branches (i.e., 1×2×2=4 at the second level of branching). In another embodiment, there are one primary path, three secondary branches, and six tertiary or final branches (i.e., 1×2×3=6). Likewise, the following combinations can be used: 1×3×2=6; 1×2×2×2=8; 1×3×3=9, or the like, although the present invention should not be limited to these combinations.

In order to substantially equalize the impedance values of branches connected to the multiple supply points, each branch connected to the multiple supply point or all branches can be provided with at least one inductance adjuster. The inductance adjuster can be made of a material which can adjust the inductance such as high ferromagnetism materials. In an embodiment, the material may be a ferrite core which is configured to be installed in the radio-frequency transmission unit.

The radio-frequency power transmission unit may comprise a metal plate and inductors having substantially equal impedance values, wherein a ferrite core may be used as the inductance adjuster which is configured to be inserted/attached into the inductors such as a hollow copper tube (having, e.g., an inner diameter of about 5 mm to about 20 mm, an outer diameter of about 6 mm to about 30 mm, and a thickness of about 0.5 mm to about 10 mm) to adjust an impedance value of the transmission system. In this embodiment, by selecting the number of ferrite cores to be inserted/attached, the impedance value can be adjusted. For example, 0 to 10 inductance adjusters (e.g., 1, 2, 3, 4, or 5 adjusters) can be installed in each branch of the radio-frequency transmission unit, wherein at least one adjuster is installed in the unit. The inductance adjuster such as a ferrite core may have a circular-ring shape when the inductors are tube-shaped. The radio-frequency power may have any frequency effective to control the degree of decomposition of a reaction gas, e.g., the degree of dissociation of hydrogen atoms from an alkyl group, preferably a frequency of about 27.12 MHz or higher (including 40.68 MHz, 60 MHz, 100 MHz, and ranges defined by the foregoing). A suitable frequency can be determined based on leakage current of the resulting film. In an embodiment, the supply points may comprise supply terminals which are disposed on a surface of the one of the electrodes in rotationally symmetrical positions with respect to the center of the surface.

In an embodiment, the radio-frequency power source may be a first radio-frequency power source and the supply system may further comprise a second radio-frequency power source emitting power which has a different frequency from that of the power emitted from the first radio-frequency power source, and which is overlaid on the power emitted from the first radio-frequency power. In the above, the second radio-frequency power may have a frequency of about 1 MHz or less (e.g., 300 kHz to 500 kHz).

In another embodiment, the present invention provides a plasma treatment apparatus for thin-film deposition comprising: (I) a reactor chamber; (II) a pair of parallel-plate electrodes disposed inside the chamber; and (III) a radio-frequency power supply system used for transmitting radio-frequency power to one of the parallel-plate electrodes via multiple supply points provided on the one of the parallel-electrodes, which radio-frequency power supply system comprises: (A) a radio-frequency power source; (B) an impedance matching circuit; and (C) a radio-frequency transmission unit for transmitting radio-frequency power from the radio-frequency power source to the multiple supply points of the one of the parallel-plate electrodes via the impedance matching circuit, which radio-frequency transmission unit comprising: (a) an inlet transmission path and multiple branches branched off from the inlet transmission path, wherein the inlet transmission path branches into two secondary branches, each secondary branch branching into two tertiary branches, each tertiary branch being connected to the supply point and having a substantially equal characteristic impedance value; and (b) at least one inductance adjuster which is removably installed in at least one branch to render substantially equal the characteristic impedance value of each branch connected to the multiple supply points. The various embodiments explained above can be adapted to the above embodiment.

The present invention can equally be adopted to a method for forming a carbon-containing silicon oxide film on a semiconductor substrate using a plasma treatment apparatus, which comprises in an embodiment: (i) determining the number of the at least one inductance adjuster to adjust characteristic impedance of each branch connected to the supply point to be equal to each other; (ii) heating the semiconductor substrate up to a given temperature; (iii) introducing a reaction gas into the reaction chamber; (iv) controlling a pressure inside the reaction chamber at a given value; and (v) applying radio-frequency power from the radio-frequency power source to one of the electrodes via the radio-frequency transmission unit.

The reaction gas may contain (a) an alkoxysilicon compound and an inert gas, (b) an alkoxysilicon compound, an oxygen-containing gas and an inert gas, or (c) an alkoxysilicon compound, ammonia, and an inert gas. In the above, the apparatus explained above including the various embodiments can be used.

In another aspect, the present invention provides a radio-frequency transmission unit configured to connect a radio-frequency power source and a reaction chamber of a plasma treatment apparatus for thin-film deposition. The unit comprises: (I) an inlet transmission path and multiple branches branched off from the inlet transmission path, wherein branches configured to be connected to one of two parallel-plate electrodes provided in the reaction chamber are multiple branchings downstream of the inlet transmission path and have a substantially equal characteristic impedance value, wherein the branches which are multiple branchings downstream of the inlet transmission path are symmetrically disposed with respect to a center of the one of the electrodes; and (II) at least one inductance adjuster which is removably installed in at least one branch to render substantially equal the characteristic impedance value of each branch connected to the multiple supply points.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

Figure 1:
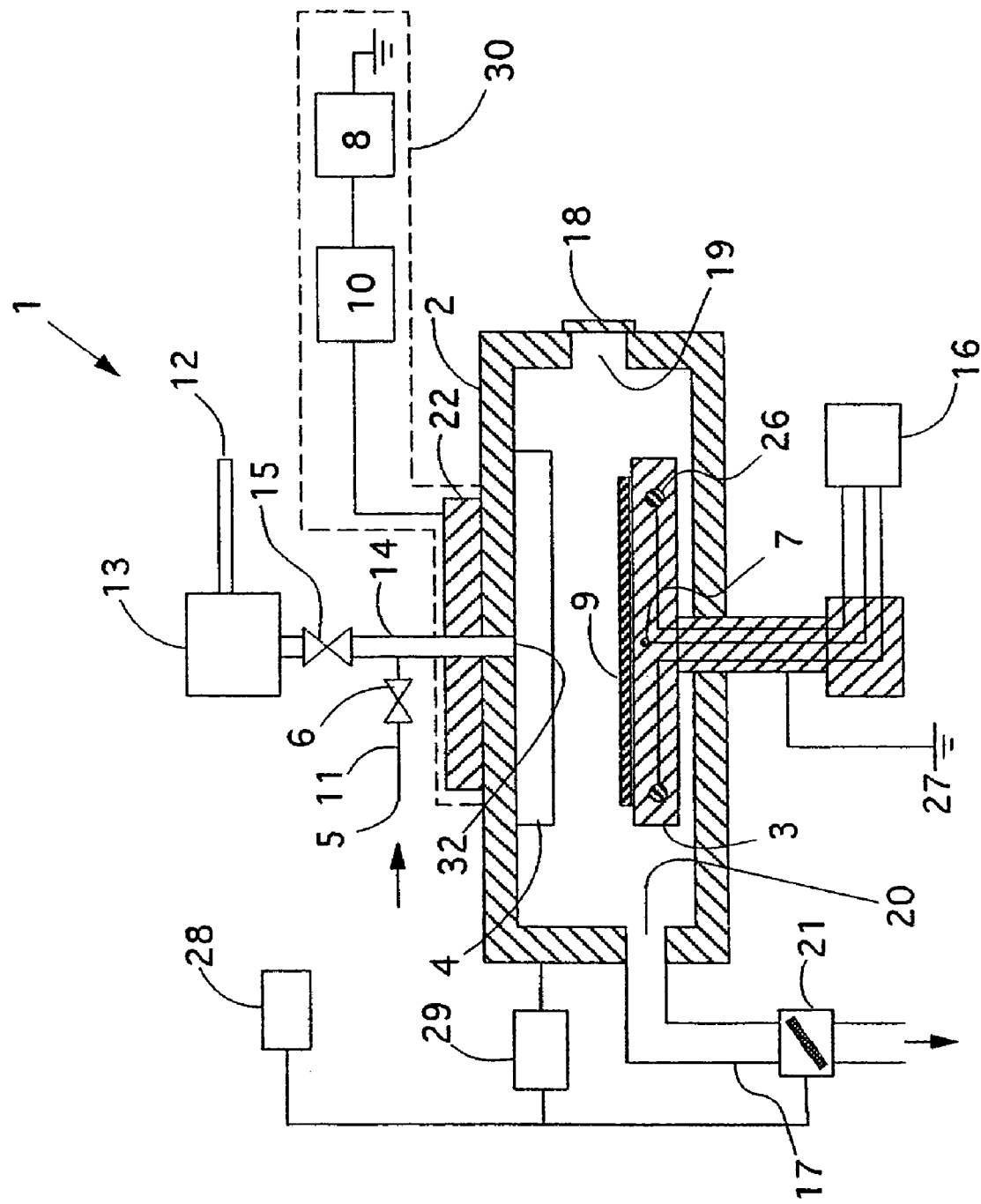
FIG. 1 is a schematic view showing a cross section of a plasma treatment apparatus according to an embodiment of the present invention.

Explanation of symbols used is as follows: 1: Plasma treatment apparatus; 2: Reaction chamber; 3: Susceptor; 4: Showerhead; 5: Reaction gas inlet port; 6: Valve; 7: Thermocouple; 8: Radio-frequency power source; 9: Semiconductor substrate; 10: Impedance matching circuit; 11: Reaction gas inlet tubing; 12: Cleaning gas inlet port; 13: Remote plasma chamber; 14: Gas inlet tubing; 15: Valve; 16: Temperature controller; 17: Tubing; 18: Gate valve; 19: Opening; 20: Exhaust port; 21: Conductance regulating valve; 22: Radio-frequency power transmission means; 26: Sheath heater; 27: Grounding; 28: Pressure controller; 29: Pressure gauge; 30: Radio-frequency power supply system; 32: Gas inlet port.

DETAILED DESCRIPTION OF THE PREFERRED EMBODIMENT

The invention will be explained further with reference to specific embodiments, but the invention should not be limited thereto.

In an embodiment, a plasma treatment apparatus for thin-film deposition having a pair of parallel-plate electrodes set up inside a reactor is characterized in that a radio-frequency power supply system comprises: a radio-frequency power source, an impedance matching circuit, and a radio-frequency transmission unit for supplying radio-frequency power from the radio-frequency power source to a supply point of one of the parallel-plate electrodes via the impedance matching circuit. The radio-frequency transmission unit may comprise four transmission systems branched out respectively from two transmission systems which are branched out from the radio-frequency transmission unit, each of which four transmission systems has a substantially equal characteristic impedance value, wherein at least one inductance adjustment means is provided in the transmission systems and can be easily attached and removed. The number of branchings should not be limited to the above. As long as radio-frequency power is supplied to the electrode uniformly, the number of branchings can be modified, e.g., in the range of 2-10 (preferably 2-4). The number of branches divided from one branch can also be adjusted, e.g., in the range of 2-5 (preferably 2).

In an embodiment, the inductance adjustment means may be a ferrite core, and the radio-frequency transmission unit may comprise a metal plate and inductors having practically equal impedance values.

In a preferred embodiment, a frequency of the radio-frequency power is 27.12 MHz or higher. In a preferred embodiment, the supply point may comprise four supply terminals set up on a surface of one of the electrodes in rotationally symmetrical positions with respect to the center of the surface. Further, in a preferred embodiment, the inductors may comprise hollow copper tubes, and an impedance value of the transmission system can be adjusted by selecting the number of ferrite cores to be inserted/attached.

In a method for forming a carbon-containing silicon oxide film on a semiconductor substrate using the plasma treatment apparatus according to an embodiment of the present invention, the characteristic impedance of each transmission system can be adjusted by changing the number of ferrite cores. In an embodiment, the method comprises heating the semiconductor substrate up to a given temperature, introducing a reaction gas containing an alkoxysilicon compound and an inert gas into a reaction chamber, controlling a pressure inside the reaction chamber at a given value, and applying radio-frequency power of 27.12 MHz or higher to one of the electrodes.

In this method, a mixture of alkoxylsilicon compound and oxygen-containing gas can also be used as a reaction gas in place of the alkoxysilicon compound.

In another embodiment, a method for forming a nitrogen-containing silicon carbide film on a semiconductor substrate may comprise adjusting characteristic impedance of each transmission system equally by adjusting the number of ferrite cores, heating the semiconductor substrate up to a given temperature, introducing a reaction gas containing an alkoxysilicon compound, ammonia and an inert gas into a reaction chamber, controlling a pressure inside the reaction chamber at a given value, and applying the first radio-frequency power of 27.12 MHz or higher and the second radio-frequency power of 300 kHz to 500 kHz by overlaying the power of two different frequencies to one of the electrodes.

The present invention is described in detail with referent to the drawings. However, the drawings show preferred embodiments, and the present invention is not limited to the drawings. FIG. 1 shows a schematic cross section of a preferred embodiment of the plasma treatment apparatus according to the present invention. A plasma treatment apparatus 1 for forming a thin film on a semiconductor substrate comprises a reaction chamber 2, a susceptor 3 which is used for placing a semiconductor substrate 9 and is set up inside the reaction chamber 2, a showerhead 4 which is set up facing and parallel to the susceptor 3 and is used for emitting a jet of reaction gas uniformly to the semiconductor substrate 9, a radio-frequency power supply system 30 for feeding radio-frequency power to the showerhead 4, and an exhaust port 20 for evacuating interior of the reaction chamber 2.

An opening 19 is provided on the side of the reaction chamber 2; the reaction chamber 2 is connected to a transfer chamber (not shown) used for carrying in/out the semiconductor substrate 9 via a gate valve 18.

The susceptor 3, which is set up inside the reaction chamber 2 and is used for placing the semiconductor substrate 9, is made of an aluminum alloy. A resistance-heating-type sheath heater 26 and a thermocouple 7 are laid buried in the susceptor 3, and are connected to an external temperature controller 16. A temperature of the semiconductor substrate 9 can be controlled at a given temperature by heating the susceptor 3 by the resistance-heating-type sheath heater 26 and monitoring temperature. The susceptor 3, on which the semiconductor substrate 9 is placed, is grounded to form one of the electrodes used for plasma discharge. As a modified example, a ceramic heater can be used in place of the aluminum alloy susceptor 3. In this case, the ceramic heater also serves as a susceptor directly holding the semiconductor substrate 9 inside the reaction chamber; the ceramic heater comprises a ceramic plate which is formed together with a resistance-heating-type heater by sintering. As a material used for the ceramic plate, nitride ceramics or oxide ceramics having durability against fluorine-based or chlorine-based active species can be used, for example. The ceramic substrate comprises preferably aluminum nitride; it can comprise aluminum oxide or magnesium oxide.

Inside the reaction chamber 2, the showerhead 4 is set up in a position parallel to and facing the above-mentioned susceptor 3. Thousands of fine openings (not shown) used for emitting a jet of reaction gas to the substrate 9 are provided in the undersurface of the showerhead 4. Gas inlet tubing 14 for introducing the reaction gas is connected to a gas inlet port 32 of the showerhead 4. Reaction gas inlet tubing 11 is connected to the gas inlet tubing 14 via a valve 6. The reaction gas with its flow rate controlled at a given value by a mass flow controller (not shown) is flowed into a gas inlet port 5 of the reaction gas inlet tubing 11. A remote plasma chamber 13 is connected to the gas inlet tubing 14 via a valve 15 and is used for activating a cleaning gas used for cleaning interior of the reaction chamber 2. Tubing used for feeding the cleaning gas is connected to the remote plasma chamber 13; upstream of the tubing, a valve (not shown) and the flow mass controller (not shown) are set up. The number of gas inlet ports 12 is determined by a type of a cleaning gas used.

According to an embodiment of the present invention, a radio-frequency power supply system 30 used for feeding radio-frequency power to the showerhead 4 is provided. The radio-frequency power supply system 30 preferably comprises, as described below in details, a radio-frequency power source 8, an impedance matching circuit (e.g. an automatic impedance matching box) 10 and a radio-frequency transmission unit 22. The showerhead 4 is electrically connected to the radio-frequency source 8 via the radio-frequency transmission unit 22 and the matching circuit 10, forming one of the electrodes for plasma discharge. When the susceptor 3 is connected to the radio-frequency power source 8, the showerhead 4 is grounded. The radio-frequency power source 8 preferably generates radio-frequency power of 27.12 MHz or higher. It is possible to set up multiple radio-frequency power sources as well. In that case, for example, the first radio-frequency power source generates radio-frequency power of 27.12 MHz and the second radio-frequency power source generates radio-frequency power from 300 kHz to 500 kHz. Radio-frequency power generated by the radio-frequency source 8 is applied to a power supply point of the showerhead 4 via the impedance matching circuit 10 and the radio-frequency transmission unit 22.

An exhaust port 20 is provided inside the reaction chamber 2 and is connected to a vacuum exhaust pump (not shown) through tubing 17. A conductance regulating valve 21 used for regulating a pressure inside the reaction chamber 2 is set up halfway between the exhaust port 20 and the vacuum pump. The conductance regulating valve 21 is electrically connected to an external controller 28. Preferably, a pressure gauge 29 used for measuring a pressure inside the reaction chamber is provided and is electrically connected to the controller 28.

Figure 2:
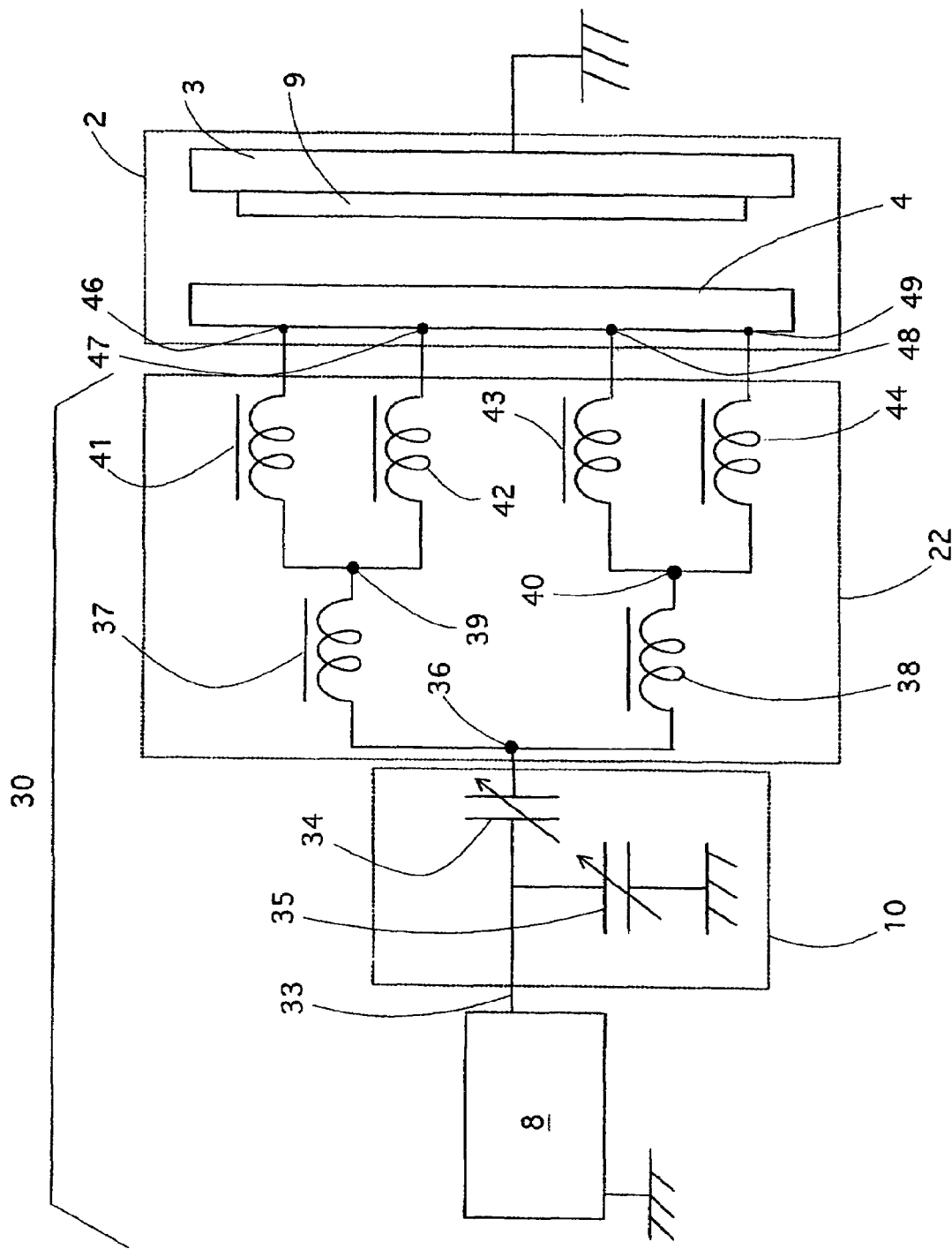
FIG. 2 is a schematic view of a radio-frequency power supply system in the plasma treatment apparatus according to an embodiment of the present invention.

FIG. 2 is an embodiment showing an enlarged schematic view of the radio-frequency power supply system 30 shown in FIG. 1. The radio-frequency power supply system 30 comprises the radio-frequency power source 8, the impedance matching circuit 10 and the radio-frequency transmission unit 22. The radio-frequency power source 8 preferably outputs 27.12 MHz radio-frequency power and is connected to the impedance matching circuit 10 via a coaxial cable 33. The impedance matching circuit 10 is an automatic impedance matching box comprising variable condensers 34 and 35 and is capable of matching load impedance with about 50 Ω (which can be in the range of 10 Ω to 200 Ω) by, e.g., automatically changing the capacitance based on a value detected by a returned power detection circuit (not shown) so that radio-frequency power returned from the load side (returned power) becomes zero. The impedance matching circuit 10 is connected to the radio-frequency transmission unit 22 via a coaxial cable. The radio-frequency transmission unit 22 comprises equivalent inductors 37 and 38 which are connected to each other in parallel, equivalent inductors 41 and 42 which are connected to each other in parallel and to the inductor 37 in series and equivalent inductors 43 and 44 which are connected to each other in parallel and to the inductor 38 in series. As shown in FIG. 2, the radio-frequency transmission system branches into two at a branchpoint 36 at the first stage; each of them further branches into two respectively at branchpoints 39 and 40 at the second stage. The radio-frequency power thus outputted from the impedance matching circuit 10 branches into four and is fed to power supply terminals 46, 47, 48 and 49. Each power supply terminal 46, 47, 48 or 49 is connected to the top surface of the showerhead 4 directly or via a metal plate.

According to a configuration of the radio-frequency transmission unit 22 according to an embodiment of the present invention, radio-frequency power branches into the following four transmission systems:

The first radio-frequency transmission system: Runs into the power supply point 46 from the branchpoint 36 via the inductor 37 and through the branchpoint 39 and via the inductor 41.

The second radio-frequency transmission system: Runs into the power supply point 47 from the branchpoint 36 via the inductor 37 and through the branchpoint 39 and via the inductor 42.

The third radio-frequency transmission system: Runs into the power supply point 48 from the branchpoint 36 via the inductor 38 and through the branchpoint 40 and via the inductor 43.

The fourth radio-frequency transmission system: Runs into the power supply point 49 from the branchpoint 36 via the inductor 38 and through the branchpoint 40 and via the inductor 44.

In each of these radio-frequency transmission systems, each characteristic impedance is substantially equal.

Figure 3:
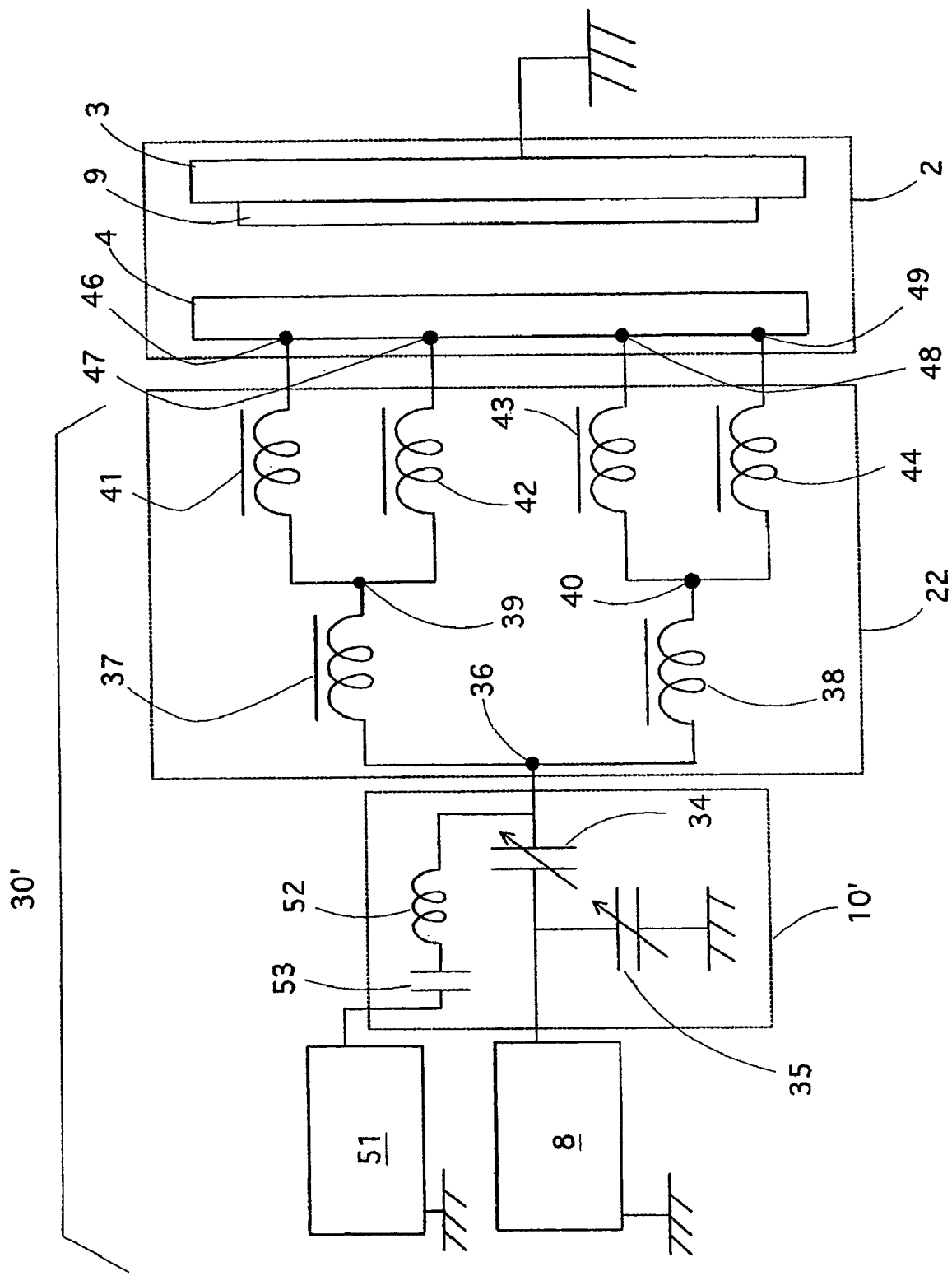
FIG. 3 is a schematic view showing a modified embodiment of the radio-frequency power supply system shown in FIG. 2.

FIG. 3 shows a modified example of the radio-frequency power supply system 30 shown in FIG. 2. A radio-frequency power supply system 30' comprises the first radio-frequency power source 8, the second radio-frequency power source 51, an impedance matching circuit 10' and the radio-frequency transmission unit 22. The first radio-frequency power source 8 outputs preferably radio-frequency power of 27.12 MHz;

the second radio-frequency power source 51 preferably outputs radio-frequency power from 300 kHz to 500 kHz. The impedance matching circuit 10' comprises an automatic impedance matching-box unit comprising variable condensers 34 and 35, and a bandpass filter unit comprising a condenser 53 and a coil 52 set up in parallel with the automatic impedance matching-box unit. The first radio-frequency power source 8 is connected to the automatic impedance matching-box unit of the impedance matching circuit 10' via an coaxial cable; the second radio-frequency power source 51 is connected to the bandpass filter unit of the impedance matching circuit 10' via an coaxial cable. A configuration of the radio-frequency transmission unit 22 can be the same as shown in FIG. 2; description is, hence, omitted.

Figure 4:
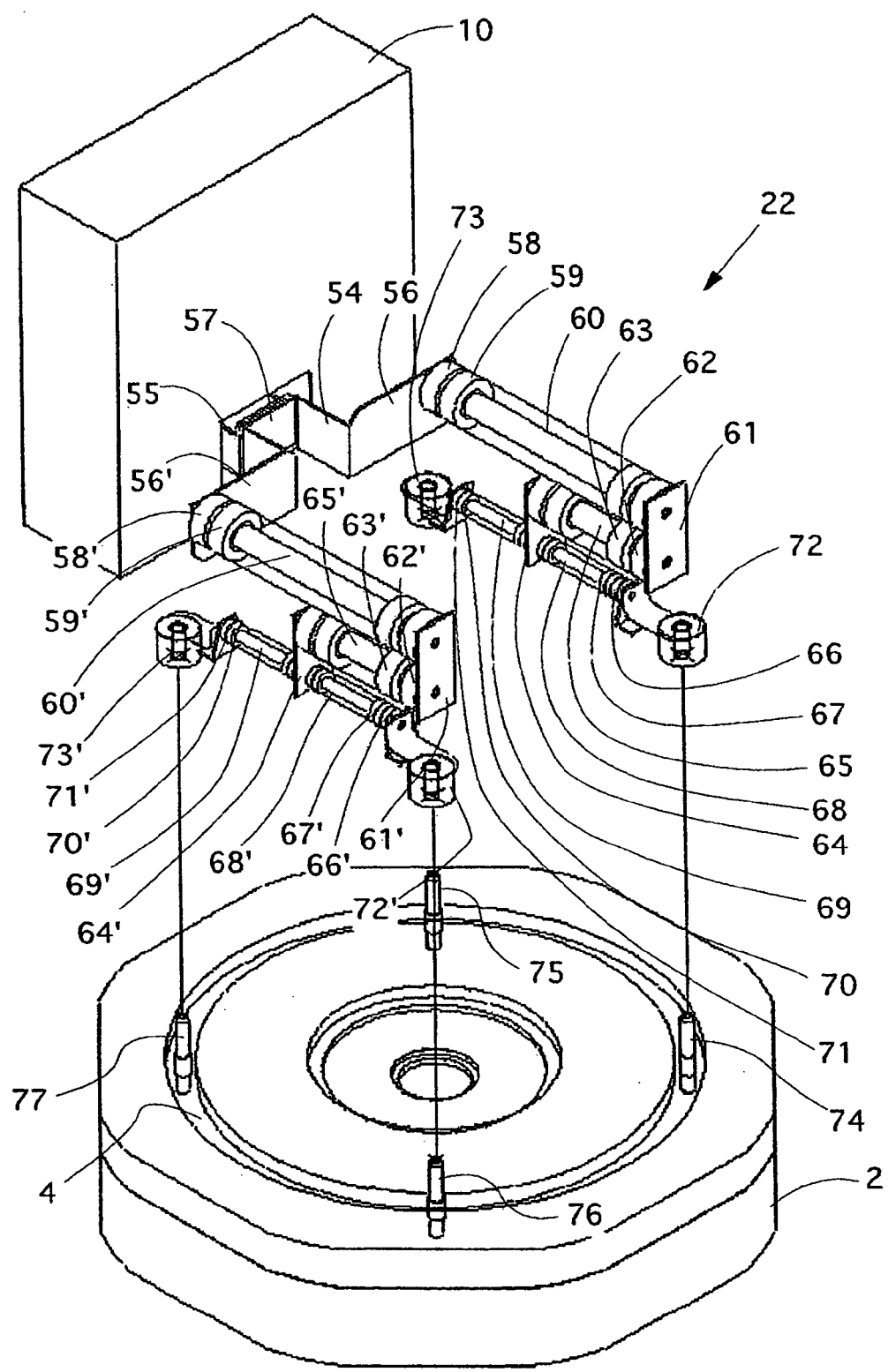
FIG. 4 is an exploded oblique perspective view of a preferable embodiment of the radio-frequency transmission unit used in the plasma treatment apparatus according to the present invention.

A preferable embodiment of the radio-frequency transmission unit 22 according to the present invention is described below. FIG. 4 shows an exploded oblique perspective view of the radio-frequency transmission unit 22 and the showerhead 4. The radio-frequency transmission unit 22 includes a metal distribution plate 54. The distribution plate 54 comprises an offset portion 57 located in the center and arm portions 56, 56' located right and left. An output terminal 55 of the impedance matching circuit 10 is connected to the offset portion 57. In the arm portions 56, 56' of the distribution plate 54, two of the first hollow copper tubes 60, 60' are connected/fastened with a bolt to be parallel to each other and perpendicular to the arm portions. At the other end of the first hollow copper tubes 60, 60', two sheets of metal coupler plates 61, 61' are connected/fastened with a bolt to be parallel to each other and perpendicular to the first hollow copper tubes. In the vicinity of both ends of the first hollow copper tubes 60, 60', circular-ring-shaped ferrite cores 59, 59' (at least one) are inserted/attached; Teflon insulation rings 58, 58' used for fixing the ferrite cores 59, 59' are inserted/attached between the ferrite cores 59, 59' and the distribution plate, and the coupler plates.

To the coupler plates 61, 61', two of the second hollow copper tubes 65, 65', which are shorter than the first hollow copper tubes, are additionally connected/fastened with a bolt to be parallel to each other and parallel to the first hollow copper tubes 60, 60'. At the other end of the second hollow copper tubes 65, 65', two metal coupler plates 64, 64' are connected/fastened with a bolt to be parallel to each other and perpendicular to the second hollow copper tubes. In the vicinity of both ends of the second hollow copper tubes 65, 65', circular-ring-shaped ferrite cores 63, 63' (at least one) are inserted/attached; Teflon insulation rings 62, 62' used for fixing the ferrite cores 63, 63' are inserted/attached between the ferrite cores 63, 63' and the coupler plates. The inductor 37 shown in FIG. 2 comprises the first hollow copper tube 60 having at least one ferrite core 59 and insulation ring, the coupler plate 61, and the second hollow copper tube 65 having at least one ferrite core 63 and insulation ring 62. Similarly, the inductor 38 shown in FIG. 2 comprises the first hollow copper tube 60' having at least one ferrite core 59' and insulation ring 58', the coupler plate 61', and the second hollow copper tube 65' having at least one ferrite core 63' and insulation ring 62'.

The third hollow copper tube 68 and the fourth hollow copper tube 69 of equal length are connected to the coupler plate 64 to be aligned with the coupler plate 64 between them and to be perpendicular to the coupler plate 64. Similarly, the third hollow copper tube 68' and the fourth hollow copper tube 69' of equal length are connected to the coupler plate 64' to be aligned with the coupler plate 64' between them and to be perpendicular to the coupler plate 64'. At the other end of the third hollow copper tubes 68, 68', metal supply connectors 72, 72' are connected; at the other ends of the fourth hollow copper tubes 69, 69', metal supply connectors 73, 73' are connected. In the vicinity of both ends of the third hollow copper tubes 68, 68', circular-ring-shaped ferrite cores 67, 67' (at least one) are inserted/attached; Teflon insulation rings 66, 66' used for fixing the ferrite cores 67, 67' are inserted/attached between the ferrite cores 67, 67' and the coupler plate, and the supply connectors. Similarly, in the vicinity of both ends of the fourth hollow copper tubes 69, 69', circular-ring-shaped ferrite cores 70, 70' (at least one) are inserted/attached; Teflon insulation rings 71, 71' used for fixing the ferrite cores 70, 70' are inserted/attached between the ferrite cores 70, 70' and the coupler plate, and the supply connectors. The inductor 41 shown in FIG. 2 comprises the third hollow copper tube 68 having at least one ferrite core 67 and insulation ring 66; the inductor 42 shown in FIG. 2 comprises the fourth hollow copper tube 69 having at least one ferrite core 70 and insulation ring 71. Similarly, the inductor 43 shown in FIG. 2 comprises the third hollow copper tube 68' having at least one ferrite core 67' and the insulation ring 66'; the inductor 44 shown in FIG. 2 comprises the fourth hollow copper tube 69' having at least one ferrite core 70' and insulation ring 71'.

The distribution plate 54, coupler plates 61, 64, 61', 64', nuts and supply connectors 72, 73, 72', 73' can be made of gold, silver, or copper, for example. If copper is used, copper plated with gold or silver of about 0.1 μm or more (e.g., 0.3-2 μm) thickness can be used. The hollow copper tubes and coupler plates or supply connectors are connected using nuts by threading exterior ends of the hollow copper tubes. For this purpose, brass nuts can also be used.

A transmission path from an output terminal 55 of the impedance matching circuit to a supply terminal 74 through the distribution plate 54 and via the first hollow copper tube 60, the coupler plate 61, the second hollow copper tube 65, the coupler plate 64, the third hollow copper tube 68, and the supply connector 72 is equivalent to the first radio-frequency transmission system shown in FIG. 2. A transmission path from an output terminal 55 of the impedance matching circuit to a supply terminal 75 through the distribution plate 54 and via the first hollow copper tube 60, the coupler plate 61, the second hollow copper tube 65, the coupler plate 64, the fourth hollow copper tube 69, and the supply connector 73 is equivalent to the second radio-frequency transmission system shown in FIG. 2. A transmission path from an output terminal 55 of the impedance matching circuit to a supply terminal 76 through the distribution plate 54 and via the first hollow copper tube 60', the coupler plate 61', the second hollow copper tube 65', the coupler plate 64', the third hollow copper tube 68', and the supply connector 72' is equivalent to the third radio-frequency transmission system shown in FIG. 2. A transmission path from an output terminal 55 of the impedance matching circuit to a supply terminal 77 through the distribution plate 54 and via the first hollow copper tube 60', the coupler plate 61', the second hollow copper tube 65', the coupler plate 64', the fourth hollow copper tube 69', and the supply connector 73' is equivalent to the fourth radio-frequency transmission system shown in FIG. 2.

In the top surface of the showerhead 4, supply terminals 74, 75, 76, 77 are set up in rotationally symmetrical positions to the center of the surface at even intervals. The supply connectors 72, 73, 72', 73' are connected to respective supply terminals 74, 75, 76, 77. Radio-frequency power thus fed from the output terminal 55 of the impedance matching circuit 10 is fed to the supply terminals 74, 75, 76, 77 set up in the showerhead 4 by breaking it down into four systems.

Impedance of four systems of the radio-frequency transmission circuit can be adjusted by adjusting the number of ferrite cores to be inserted/attached to the first to the fourth hollow copper tubes. Consequently, because impedance of the four systems of the radio-frequency transmission circuit can be adjusted independently, it becomes possible to equalize a radio-frequency power value fed to four supply terminals 74, 75, 76, 77.

Figure 5:
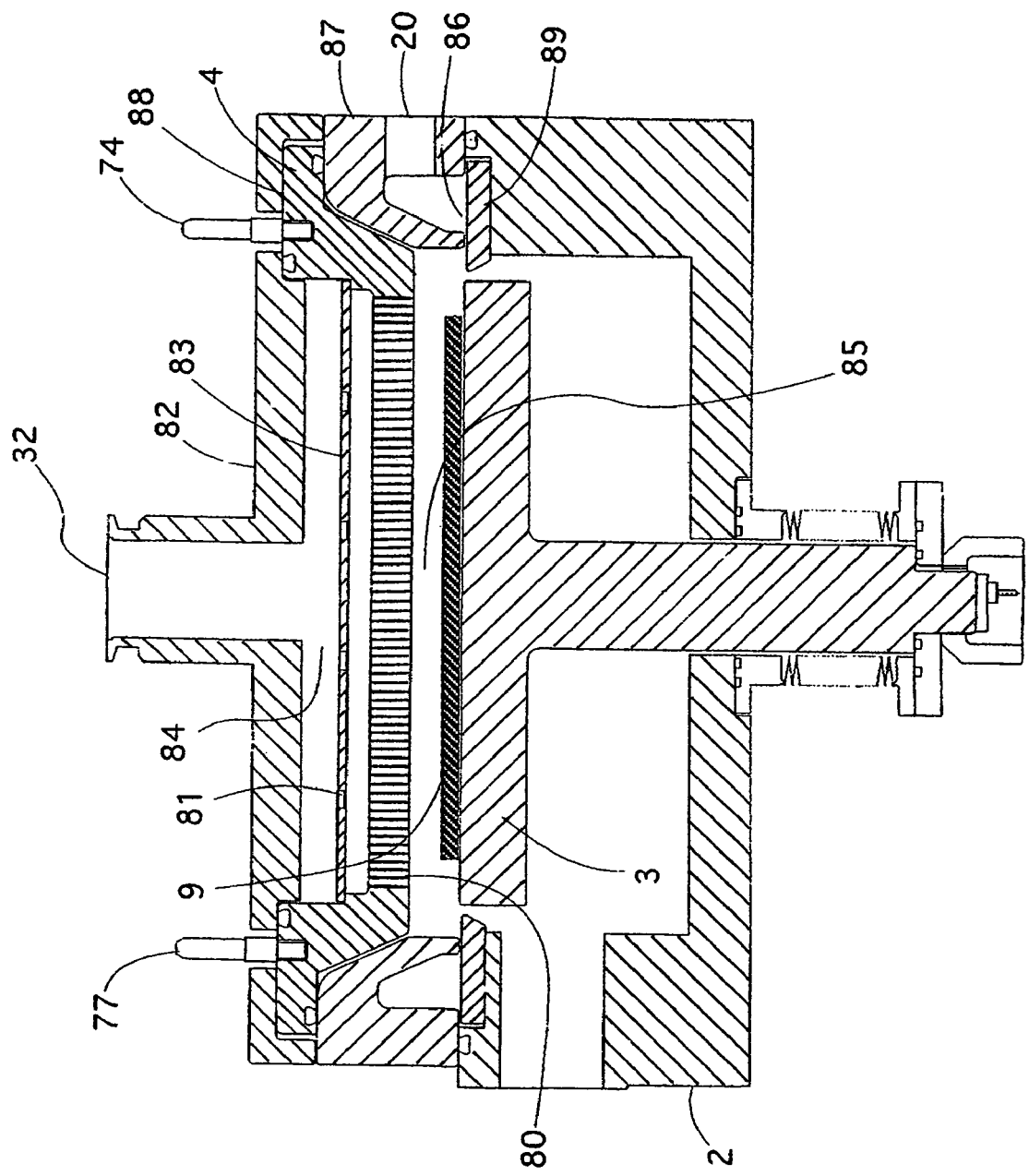
FIG. 5 is an enlarged view of a reaction chamber used in a plasma treatment apparatus according to an embodiment of the present invention.

FIG. 5 is an embodiment showing an enlarged cross section of the reaction chamber 2 shown in FIG. 1. The susceptor 3 used for placing the semiconductor substrate 9 is set up inside the reaction chamber 2. The showerhead 4 facing the susceptor 3 is set up on the ceiling of the interior of the reaction chamber 2. Thousands of fine openings 80 are provided at the bottom surface of the showerhead 4. A space 84 is provided between the showerhead 4 and the ceiling 82 of the reaction chamber; inside the space 84, a gas distribution plate 83 is set up parallel to the showerhead 4. The given number of openings 81 (4 to 100, preferably 6 to 20) are provided in the gas distribution plate 83. The gas inlet port 32 is provided in the center of the ceiling of the reaction chamber; reaction gas introduced from the gas inlet port 32 passes the openings 81 of the gas distribution plates and is emitted to the semiconductor substrate 9 from the fine openings 80 of the showerhead 4. In the peripheral top surface 88 of the showerhead 4, the supply terminals 74, 75, 76, 77 are combined in rotationally symmetrical positions to the center of the showerhead 4 at even intervals. When radio-frequency power is fed to the supply terminals, plasma discharge is formed in a reaction space 85 between the showerhead 4 and the susceptor 3. Down below the showerhead 4, an exhaust balancer 87 is set up. Underneath the balancer 87, a circular-ring-shaped ring plate 89 is set up. A channel 86 comprises the exhaust balancer 87 and the ring plate 89. An exhaust port 20 is provided on the side of the exhaust balancer 87; passing through the channel 86, gas inside the reaction chamber 2 is evacuated via the exhaust port 20 by the external vacuum pump.

The method of forming a carbon-containing silicon oxide film according to a preferred embodiment of the present invention is described below. The plasma treatment apparatus 1 shown in FIG. 1 is used for forming a carbon-containing silicon oxide film. A Ø300 mm semiconductor substrate 9 transferred from the transfer chamber is placed on the susceptor 3 inside the reaction chamber 2. A distance between the showerhead 4 and the susceptor 3 (an electrode spacing) is set at about 5 mm to about 100 mm, preferably from about 10 mm to about 50 mm, more preferably from about 20 mm to about 30 mm. Before deposition is started, characteristic impedance values of four transmission systems may be adjusted to be equal by adjusting the number of ferrite cores.

The method of forming a carbon-containing silicon oxide film according to an embodiment of the present invention includes a process of heating the semiconductor substrate 9. By applying the electrical current from the temperature controller 16 to the sheath heater 26, the semiconductor substrate 9 is heated by the susceptor 3 at about 200° C. to about 420° C., preferably at about 300° C. to about 400° C., more preferably at about 350° C. to about 390° C. Simultaneously, the showerhead 4 is heated at about 100° C. to about 300° C. by a heater (not shown) installed in the upper portion of the showerhead.

Additionally, the method of forming a carbon-containing silicon oxide film according to an embodiment of the present invention includes a process of introducing a reaction gas into the reaction chamber 2. The reaction gas comprises a source gas and an added gas. A source gas comprises an alkoxysilicon compound comprising silicon, oxygen and hydrocarbon. As an alkoxysilicon compound, preferably any one of dimethoxydimethylsilane Si(OCH3)2(CH3)2 (hereinafter referred to as "DMDMOS") is used. Besides this, any one of Si(OCH3)3CH3, SiOCH3(CH3)3, Si2O(CH3)6, Si2O(OCH3)2(CH3)4, Si(OCH3)2C2H5CH3, and Si(OCH3)2(C2H5)5 can also be used. In place of an alkylsilicon compound, a mixture of an alkoxysilicon compound and an oxygen-containing gas can also be used. In this case, Si(CH3)4, SiH(CH3)3, SiH2(CH3)2, etc. is used as an alkylsilicon compound; CO2, N2O, O2, O3 or a mixture of these is used as an oxygen-containing gas. An added gas comprises an inert gas or nitrogen gas, or a mixed gas of an inert gas and nitrogen gas. The inert gas used here is preferably helium; argon, neon, xenon or krypton can also be used. A flow rate of the source gas is controlled by a mass flow controller at about 100 sccm to about 500 sccm, preferably at about 150 sccm to about 300 sccm, more preferably at about 200 sccm to about 250 sccm and is introduced into the showerhead 4 from the gas inlet port 5 via the gas inlet port 32. Similarly, a flow rate of the added gas is controlled by a mass flow controller at about 20 sccm to about 500 sccm, preferably at about 30 sccm to about 200 sccm, more preferably at about 50 sccm to about 150 sccm and is introduced into the showerhead 4 from the gas inlet port 5 via the gas inlet port 32.

Furthermore, the method of forming a carbon-containing silicon oxide film according to an embodiment of the present invention includes a process of maintaining a pressure inside the reaction chamber 2 at about 200 Pa to about 2660 Pa, preferably at about 400 Pa to about 1000 Pa, more preferably at about 600 Pa to about 800 Pa. Pressure values inside the reaction chamber 2 are monitored by the pressure gauge 29 and are transferred to the controller 28. Responding to monitored pressure values, the controller 28 adjusts valve travel of the conductance regulating valve 21 and maintains a pressure inside the reaction chamber 2 at a given value.

Furthermore, the method of forming a carbon-containing silicon oxide film according to an embodiment of the present invention includes a process of feeding about 27.12 MHz radio-frequency power to the showerhead 4 by the radio-frequency power supply system 30. Radio-frequency power is applied at about 1000 W to about 5000 W, preferably at 1500 to 3000 W, more preferably at about 2000 W to about 3000 W. The radio-frequency power is broken down equally into four by the radio-frequency transmission unit 22 and is fed to respective supply terminals 74, 75, 76, 77.

Using the method according to an embodiment of the present invention, a carbon-containing silicon oxide film having a dielectric constant of 2.5 to 3.1 is able to be deposited at a rate of about 400 nm/min. or higher. Film thickness non-uniformity in a Ø300 mm semiconductor substrate (which is expressed by a value obtained by dividing (the maximum thickness value−the minimum thickness value)/2 by a mean thickness value using % as a unit) is able to be suppressed to approximately ±1.5% to ±3%.

The method for forming a nitrogen-containing silicon carbide film according to an embodiment of the present invention is described below. In the case of a nitrogen-containing silicon carbide film, the plasma treatment apparatus shown in FIG. 1 is essentially used in the same manner as used for forming a carbon-containing silicon oxide film; the radio-frequency supply system 30' shown in FIG. 3, however, is used for feeding radio-frequency power. A Ø300 mm semiconductor substrate transferred from the transfer chamber is placed on the susceptor 3 inside the reaction chamber 2. A distance between the showerhead 4 and the susceptor 3 (an electrode spacing) is set at about 5 mm to about 100 mm, preferably from about 10 mm to about 50 mm, more preferably from about 15 mm to about 25 mm. Before deposition is started, characteristic impedance values of four transmission systems may be adjusted to be equal by adjusting the number of ferrite cores.

The method for forming a nitrogen-containing silicon carbide film according to an embodiment of the present invention includes a process of heating the semiconductor substrate 9. By applying the electrical current from the temperature controller 16 to the sheath heater 26, the semiconductor substrate 9 placed on the susceptor 3 is heated at about 250° C. to about 420° C., preferably at about 300° C. to about 390° C., more preferably at about 330° C. to about 370° C. Simultaneously, the showerhead 4 is heated at about 100° C. to about 300° C. by a heater (not shown) installed in the upper portion of the showerhead 4.

Additionally, the method for forming a nitrogen-containing silicon carbide film according to an embodiment of the present invention includes a process of introducing a reaction gas into the reaction chamber 2. The reaction gas comprises a source gas and an added gas. A source gas comprises an alkylsilicon compound comprising silicon and hydrocarbon, and NH3. As an alkylsilicon compound, preferably Si(CH3)4 is used; SiH(CH3)3 can also be used. An added gas comprises an inert gas or nitrogen gas. The inert gas used here is preferably helium; argon, neon, xenon or krypton can also be used. A flow rate of Si(CH3)4 used as a source gas is controlled by a mass flow controller at about 100 sccm to about 1500 sccm, preferably at about 200 sccm to about 1000 sccm, more preferably at about 250 sccm to about 500 sccm and is introduced into the showerhead 4 from the gas inlet port 5 via the gas inlet port 32. A flow rate of NH3 used as a source gas is controlled by a mass flow controller at about 100 sccm to about 1500 sccm, preferably at about 200 sccm to about 500 sccm, more preferably at about 250 sccm to about 500 sccm and is introduced into the showerhead 4 from the gas inlet port 5 via the gas inlet port 32. A flow rate of helium used as an added gas is controlled by a mass flow controller at about 1000 sccm to about 15000 sccm, preferably at about 2000 sccm to about 10000 sccm, more preferably at about 3500 sccm to about 6000 sccm, and is introduced into the showerhead 4 from the gas inlet port 5 via the gas inlet port 32.

Furthermore, the method for forming a nitrogen-containing silicon carbide film according to an embodiment of the present invention includes a process of maintaining a pressure inside the reaction chamber 2 at about 200 Pa to about 2660 Pa, preferably at about 400 Pa to about 1000 Pa, more preferably at about 600 Pa to about 800 Pa. Pressure values inside the reaction chamber 2 are monitored by the pressure gauge 29 and are transferred to the controller 28. Responding to monitored pressure values, the controller 28 adjusts valve travel of the conductance regulating valve 21 and maintains a pressure inside the reaction chamber 2 at a given value.

Furthermore, the method for forming a nitrogen-containing silicon carbide film according to an embodiment of the present invention includes a process of feeding the first radio-frequency power of about 27.12 MHz and the second radio-frequency power of about 300 kHz to about 500 kHz by the radio-frequency power supply system 30' to the showerhead 4 by overlapping the power of two different frequencies. The first radio-frequency power is applied at about 300 W to about 1500 W, preferably at about 500 W to about 1000 W; the second radio-frequency power is applied at about 30 W to about 500 W, preferably at about 75 W to about 300 W. The radio-frequency power is broken down equally into four by the radio-frequency transmission unit 22 and is fed to respective supply terminals 74, 75, 76, 77.

Using the method according to an embodiment of the present invention, a nitrogen-containing silicon carbide film having a dielectric constant of 4.0 to 5.0 is able to be deposited at a rate of about 100 nm/min. or higher. Film thickness non-uniformity in a Ø300 mm semiconductor substrate is able to be suppressed to approximately ±1.5% to ±3%.

As a modified example, oxygen-containing silicon carbide films can be formed in place of nitrogen-containing silicon carbide films. In that case, DMDMOS and CO2 as source gases and He as an added gas are used. Si(CH3)4 or SiH(CH3)3 and CO2, O2 or N2O can also be used as source gases.

EXAMPLES

Experiments conducted for forming a carbon-containing silicon oxide film using the plasma treatment apparatus according to embodiments of the present invention are described below. The present invention should not be limited to the experiments. In the experiments, DM-DMOS was used as a source gas and helium was used as an added gas. By altering a flow rate of reaction gas and radio-frequency power values, film characteristics were evaluated.

Deposition conditions:

Experiment 1

| | | |
|---|---|---|
| Electrode spacing: | | 25 mm |
| Source gas: | DM-DMOS | 140 sccm |
| Added gas: | He | 50 sccm |
| RF power: | 27.12 MHz | 1700 W |
| Substrate temperature: | | 385° C. |
| Pressure: | | 560 Pa |

Experiment 2

| | | |
|---|---|---|
| Electrode spacing: | | 25 mm |
| Source gas: | DM-DMOS | 100 sccm |
| Added gas: | He | 80 sccm |
| RF power: | 27.12 MHz | 1600 W |
| Substrate temperature: | | 385° C. |
| Pressure: | | 560 Pa |

Experiment 3

| | | |
|---|---|---|
| Electrode spacing: | | 25 mm |
| Source gas: | DM-DMOS | 220 sccm |
| Added gas: | He | 80 sccm |
| RF power: | 27.12 MHz | 2500 W |
| Substrate temperature: | | 385° C. |
| Pressure: | | 560 Pa |

Experiment 4

| | | |
|---|---|---|
| Electrode spacing: | | 25 mm |
| Source gas: | DM-DMOS | 180 sccm |
| Added gas: | He | 100 sccm |
| RF power: | 27.12 MHz | 2200 W |
| Substrate temperature: | | 385° C. |
| Pressure: | | 560 Pa |

Film characteristics of carbon-containing silicon oxide films formed under the above-mentioned conditions are shown in Table 1. A mercury probe measuring instrument was used for measuring dielectric constants.

TABLE 1

| | Exp. 1 | Exp. 2 | Exp. 3 | Exp. 4 |
|---|---|---|---|---|
| Deposition Rate (nm/min.) | 450 | 400 | 550 | 500 |
| Dielectric Constant | 2.85 | 2.93 | 2.85 | 2.92 |
| Refractive Index | 1.42 | 1.42 | 1.42 | 1.42 |
| Film Stress (MPa) | 50 | 60 | 50 | 55 |

TABLE 1-continued

|  | Exp. 1 | Exp. 2 | Exp. 3 | Exp. 4 |
|---|---|---|---|---|
| Break-down Voltage (MV/cm) | 5.6 | 5.6 | 5.6 | 5.6 |
| Hardness (GPa) | 2.0 | 2.5 | 1.9 | 2.4 |
| Modulus of Elasticity (GPa) | 10 | 15 | 10 | 13 |
| Film Thickness Non-uniformity (%) | ±1.3 | ±1.5 | ±1.7 | ±1.5 |

Based on the results shown in Table 1, carbon-containing silicon oxide films having low dielectric constants and high mechanical strength were able to be formed according to embodiments of the present invention. This may be because excessive decomposition of the reaction gas was controlled by 27.12 MHz radio-frequency power applied and carbon-containing silicon oxide films having a siloxane structure was formed.

Additionally, based on the results shown in Table 1, according to embodiments of the present invention, film thickness non-uniformity when deposited on Ø300 mm large-diameter semiconductor substrates was able to be controlled within approximately ±1.7%. This may be because characteristic impedance and power loss were able to be adjusted equally in four transmission systems across the board from the impedance matching circuit to supply terminals by adopting hollow copper tubes as inductors and by inserting/attaching the appropriate number of ferrite cores, which can be easily attached and removed, to the hollow copper tubes.

Experiments conducted for forming a nitrogen-containing silicon carbide film using the plasma treatment apparatus according to embodiments of the present invention are described below. In the experiments, Si(CH3)4 and NH3 were used as source gases and helium was used as an added gas. By altering a flow rate of reaction gas, radio-frequency power and pressure values, film characteristics were evaluated.

| Deposition conditions: | |
|---|---|
| Experiment 5 | |
| Electrode spacing: | 20 mm |
| Source gases: | Si(CH3)4   250 sccm |
|  | NH3   250 sccm |
| Added gas: | He   2500 sccm |
| First RF power: | 27.12 MHz   800 W |
| Second RF power: | 400 kHz   100 W |
| Substrate temperature: | 365° C. |
| Pressure: | 600 Pa |
| Experiment 6 | |
| Electrode spacing: | 20 mm |
| Source gases: | Si(CH3)4   350 sccm |
|  | NH3   350 sccm |
| Added gas: | He   4500 sccm |
| First RF power: | 27.12 MHz   830 W |
| Second RF power: | 400 kHz   100 W |
| Substrate temperature: | 365° C. |
| Pressure: | 665 Pa |

Film characteristics of nitrogen-containing silicon carbide films formed under the above-mentioned conditions are shown in Table 2. A mercury probe measuring instrument was used for measuring dielectric constants. Voltage applied for measuring leakage current was 2 MV/cm.

TABLE 2

|  | Exp. 5 | Exp. 6 |
|---|---|---|
| Growth Rate (nm/min.) | 100 | 100 |
| Dielectric Constant | 4.55 | 4.40 |
| Refractive Index | 1.99 | 1.90 |
| Film Stress (MPa) | −250 | −210 |
| Leakage Current $10^{-8}$ (A/cm$^2$) | 5.0 | 2.0 |
| Film Thickness Non-uniformity (%) | ±1.8 | ±1.6 |

Based on the results shown in Table 2, nitrogen-containing silicon carbide films having low dielectric constants and less leakage current were able to be formed according to embodiments of the present invention. This may be because nitrogen-containing silicon carbide films incorporating hydrogen atoms as methyl groups were formed because excessive decomposition of alkyl groups in the reaction gas was controlled by overlapped application of 27.12 MHz radio-frequency power and 400 kHz radio-frequency power.

Additionally, based on the results shown in Table 2, according to embodiments of the present invention, film thickness non-uniformity when deposited on Ø300 mm large-diameter semiconductor substrates was able to be controlled within approximately ±1.8%. This may be because characteristic impedance and power loss were able to be adjusted equally in four transmission systems across the board from the impedance matching circuit to supply terminals by adopting hollow copper tubes as inductors and by inserting/attaching the appropriate number of ferrite cores, which can be easily attached and removed, to the hollow copper tubes.

[Effects]

Using the plasma treatment apparatus according to an embodiment of the present invention, it becomes possible to achieve film thickness non-uniformity of ±3% or less in thin-film deposition to large-diameter Ø300 mm semiconductor substrates.

Additionally, using the method of forming carbon-containing silicon oxide films according to an embodiment of the present invention, carbon-containing silicon oxide films having low dielectric constants and high mechanical strength can be formed using 27.12 MHz radio-frequency power.

Furthermore, using the method of forming nitrogen-containing silicon carbide films according to an embodiment of the present invention, nitrogen-containing silicon carbide films having low dielectric constants and less leakage current can be formed using 27.12 MHz radio-frequency power.

This application claims priority to Japanese Patent Application No. 2003-101993, filed Apr. 4, 2003, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A plasma treatment apparatus for thin-film deposition comprising:
 a reactor chamber;

a pair of parallel-plate electrodes disposed inside the chamber, between which a thin film is to be formed on a substrate; and a radio-frequency power supply system used for transmitting radio-frequency power to one of the parallel-plate electrodes via multiple supply points provided on the one of the parallel-plate electrodes, said radio-frequency power supply system comprises:
  a radio-frequency power source; and
    a radio-frequency transmission unit for transmitting radio-frequency power from the radio-frequency power source simultaneously to the multiple supply points of the one of the parallel-plate electrodes, said radio-frequency transmission unit comprising:
an inlet transmission path and multiple branches branched off from the inlet transmission path, wherein each branch connected to the supply point of the parallel-electrode is multiple branchings downstream of the inlet transmission path and has a substantially equal characteristic impedance value, said multiple branchings including a first branching and a second branching downstream of the first branching; and
  at least one inductance adjuster which is removably installed in each branch to render substantially equal the characteristic impedance value of each branch connected to the multiple supply points, wherein each branch comprises a hollow copper tube as an inductor, each inductance adjuster is a ferrite core which removably encircles the hollow copper tube to adjust an impedance value of the transmission system, the hollow copper tube of the second branching is smaller in diameter than the hollow copper tube of the first branching, and the ferrite core encircling the hollow copper tube of the second branching is smaller than the ferrite core encircling the hollow copper tube of the first branching.

2. The plasma treatment apparatus according to claim 1, wherein the radio-frequency power supply system further comprises an impedance matching circuit between the radio-frequency power source and the radio-frequency transmission unit.

3. The plasma treatment apparatus according to claim 2, wherein the impedance matching circuit is connected to the radio-frequency transmission unit by a co-axial cable.

4. The plasma treatment apparatus according to claim 1, wherein each branch connected to the multiple supply point is one of two branchings downstream of the inlet transmission path, and four branches are connected to the multiple supply points.

5. The plasma treatment apparatus according to claim 1, wherein the radio-frequency power transmission unit comprises a metal plate and the inductors have substantially equal impedance values.

6. The plasma treatment apparatus according to claim 1, wherein the hollow copper tube of the first branching and the hollow copper tube of the second branching are connected by a metal plate and the ferrite core has a circular-ring shape which can be inserted/attached into the hollow copper tube to adjust an impedance value of the transmission system by selecting the number of ferrite cores to be inserted/attached.

7. The plasma treatment apparatus according to claim 1, wherein the radio-frequency power has a frequency of about 27.12 MHz or higher.

8. The plasma treatment apparatus according to claim 1, wherein the supply points comprise supply terminals which are disposed on a surface of the one of the electrodes in rotationally symmetrical positions with respect to the center of the surface.

9. The plasma treatment apparatus according to claim 8, wherein the supply terminals are disposed in the vicinity of an outer periphery of the electrode.

10. The plasma treatment apparatus according to claim 9, wherein the supply terminals are disposed in the vicinity of and along the outer periphery of the electrode at equal intervals.

11. The plasma treatment apparatus according to claim 1, wherein the radio-frequency power source is a first radio-frequency power source and the supply system further comprises a second radio-frequency power source emitting power which has a different frequency from that of the power emitted from the first radio-frequency power source, and which is overlaid on the power emitted from the first radio-frequency power.

12. The plasma treatment apparatus according to claim 11, wherein the second radio-frequency power has a frequency of about 1 MHz or less.

13. The plasma treatment apparatus according to claim 1, wherein the parallel-plate electrodes are a susceptor and a showerhead with thousands of openings for jetting gas, wherein the supply terminals are connected to the showerhead.

14. The plasma treatment apparatus according to claim 1, wherein each of the branches connected to the multiple supply points is provided with multiple inductance adjusters as the at least one inductance adjuster, the number of the multiple inductance adjusters being different at at least one branch relative to others of the branches to render substantially equal the characteristic impedance value of each branch connected to the multiple supply points.

15. The plasma treatment apparatus according to claim 14, wherein the substantially equal characteristic impedance value of each branch connected to the multiple supply points is such that film thickness non-uniformity of ±3% or less is achieved in film deposition onto a large-area semiconductor substrate having a diameter of 300 mm using the plasma treatment apparatus.

16. A plasma treatment apparatus for thin-film deposition comprising:
  a reactor chamber;
  a pair of parallel-plate electrodes disposed inside the chamber, between which a thin film is to be formed on a substrate; and
  a radio-frequency power supply system used for transmitting radio-frequency power to one of the parallel-plate electrodes via multiple supply points provided on the one of the parallel-electrodes, said radio-frequency power supply system comprises:
  a radio-frequency power source;
  an impedance matching circuit; and
  a radio-frequency transmission unit for transmitting radio-frequency power from the radio-frequency power source simultaneously to the multiple supply points of the one of the parallel-plate electrodes via the impedance matching circuit, said radio-frequency transmission unit comprising:
  an inlet transmission path and multiple branches branched off from the inlet transmission path, wherein the inlet transmission path branches into two secondary branches, each secondary branch branching into two tertiary branches, each tertiary branch being connected to the supply point and having a substantially equal characteristic impedance value; and at least one inductance adjuster which is removably installed in at least one branch to render substantially equal the characteristic impedance value of each branch connected to the multiple supply points, wherein each branch comprises a hollow copper tube as an inductor, each inductance adjuster is a ferrite core which removably encircles the hollow copper tube to adjust an impedance value of the transmission system, the hollow copper tube of the tertiary branching is smaller in diameter than the hollow copper tube of the secondary branching, and the ferrite core encircling the hollow copper tube of the tertiary branching is smaller than the ferrite core encircling the hollow copper tube of the secondary branching.

17. A radio-frequency transmission unit configured to connect a radio-frequency power source and a reaction chamber of a plasma treatment apparatus for thin-film deposition, comprising:

an inlet transmission path and multiple branches branched off from the inlet transmission path, wherein branches configured to be connected to one of two parallel-plate electrodes provided in the reaction chamber are multiple branchings downstream of the inlet transmission path and have a substantially equal characteristic impedance value, wherein the branches which are multiple branchings downstream of the inlet transmission path are symmetrically disposed with respect to a center of the one of the electrodes for transmitting radio-frequency power from the radio-frequency power source simultaneously to the multiple branching, said multiple branchings including a first branching and a second branching downstream of the first branching; and at least one inductance adjuster which is removably installed in at least one branch to render substantially equal the characteristic impedance value of each branch connected to the multiple supply points, wherein each branch comprises a hollow copper tube as an inductor, each inductance adjuster is a ferrite core which removably encircles the hollow copper tube to adjust an impedance value of the transmission system, the hollow copper tube of the second branching is smaller in diameter than the hollow copper tube of the first branching, and the ferrite core encircling the hollow copper tube of the second branching is smaller than the ferrite core encircling the hollow copper tube of the first branching.

18. The radio-frequency transmission unit according to claim 17, which is connected to an impedance matching circuit via a coaxial cable.

* * * * *

UNITED STATES PATENT AND TRADEMARK OFFICE
CERTIFICATE OF CORRECTION

| | | |
|---|---|---|
| PATENT NO. | : 7,520,244 B2 | Page 1 of 1 |
| APPLICATION NO. | : 10/807528 | |
| DATED | : April 21, 2009 | |
| INVENTOR(S) | : Yamagishi et al. | |

It is certified that error appears in the above-identified patent and that said Letters Patent is hereby corrected as shown below:

In column 1, under the title, please insert the following:

--Related Application
This application claims priority to Japanese patent application No. 2003-101993 filed on May 4, 2003.--

Signed and Sealed this

Eighth Day of September, 2009

David J. Kappos
*Director of the United States Patent and Trademark Office*